(12) United States Patent
Chu et al.

(10) Patent No.: US 6,242,331 B1
(45) Date of Patent: Jun. 5, 2001

(54) METHOD TO REDUCE DEVICE CONTACT RESISTANCE USING A HYDROGEN PEROXIDE TREATMENT

(75) Inventors: Cheng-Yu Chu; Te-Fu Tseng, both of Hsin-Chu; Chai-Der Chang, Chia-Yi; Chi-Hung Liao, Taipei, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/467,129

(22) Filed: Dec. 20, 1999

(51) Int. Cl.$^7$ ............................................. H01L 21/3205
(52) U.S. Cl. ..................... 438/586; 438/637; 438/677; 438/756
(58) Field of Search ..................... 438/637, 677, 438/756, 586, 624, 595; 134/4

(56) References Cited

U.S. PATENT DOCUMENTS

| | | | |
|---|---|---|---|
| 4,752,505 | 6/1988 | Arac | 427/307 |
| 5,229,334 | 7/1993 | Kato | 437/239 |
| 5,308,400 | 5/1994 | Chen | 134/2 |
| 5,486,266 | 1/1996 | Tsai et al. | 156/657.1 |
| 5,626,716 * | 5/1997 | Bosch et al. | 438/723 |
| 5,670,019 | 9/1997 | Huang | 156/643.1 |
| 5,801,096 | 9/1998 | Lee et al. | 438/636 |
| 5,885,865 * | 3/1999 | Liang et al. | 438/253 |
| 5,885,895 * | 3/1999 | Liu et al. | 438/637 |
| 5,908,509 * | 6/1999 | Olesen et al. | 134/1.3 |
| 5,939,333 * | 8/1999 | Hurley et al. | 438/241 |
| 5,972,123 * | 10/1999 | Verhaverbeke | 134/3 |
| 6,046,103 * | 4/2000 | Thei et al. | 438/624 |

* cited by examiner

*Primary Examiner*—T. N. Quach
(74) *Attorney, Agent, or Firm*—George O. Saile; Stephen B. Ackerma

(57) ABSTRACT

A method for developing a semiconductor device low resistance electrical contact is described. In this process a gate oxide layer followed by a polysilicon layer is deposited on the semiconductor substrate in proximity to the device contact area. It is subsequently patterned with photoresist and etched to produce the desired gate structure. This is followed by a deposited layer of silicon dioxide or silicon nitride (SIN) which is appropriately patterned and etched to form gate isolation spacers. Then a nominal 300 Å layer of silicon nitride (SIN) is deposited followed by a layer of tetraethyl orthosilicate (TEOS) or borophosphosilicate glass (BPSG). The contact area is defined by photolithography, and the passivation layers are etched either by a dry etch such as a RIE process, or a combination of a wet BOE process followed by a dry etch, to form the metal contact holes. Prior to sputtering the contact metal, the contact area is cleaned with a 30 second dip in a BOE solution, followed by a Hydrogen Peroxide ($H_2O_2$) dip. This $H_2O_2$ cleaning step enables lower device contact resistance for the P+ contact areas.

32 Claims, 2 Drawing Sheets

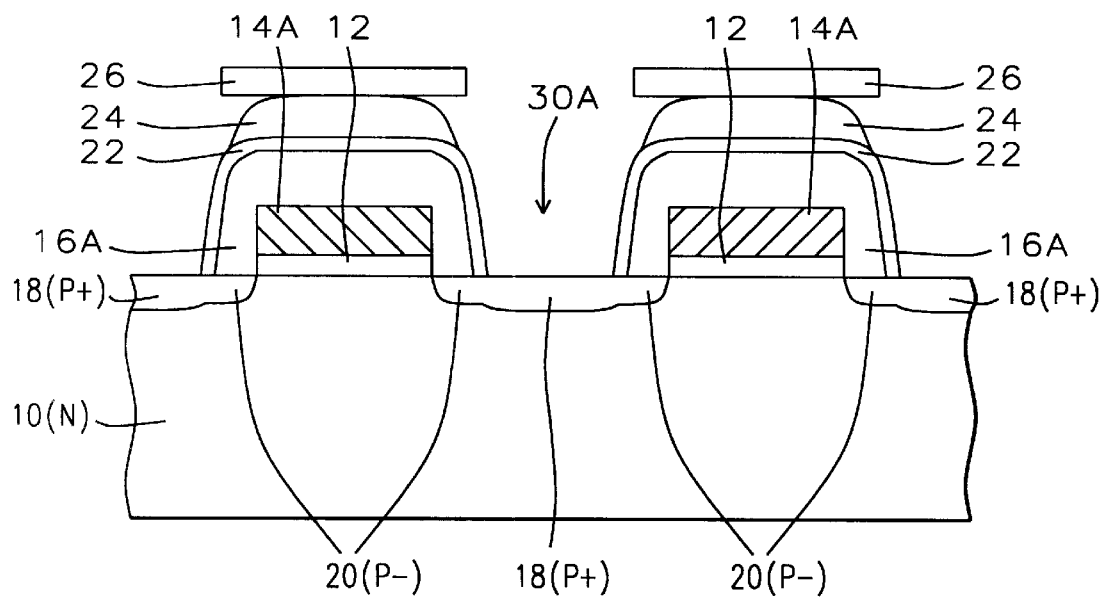
FIG. 1 – Prior Art
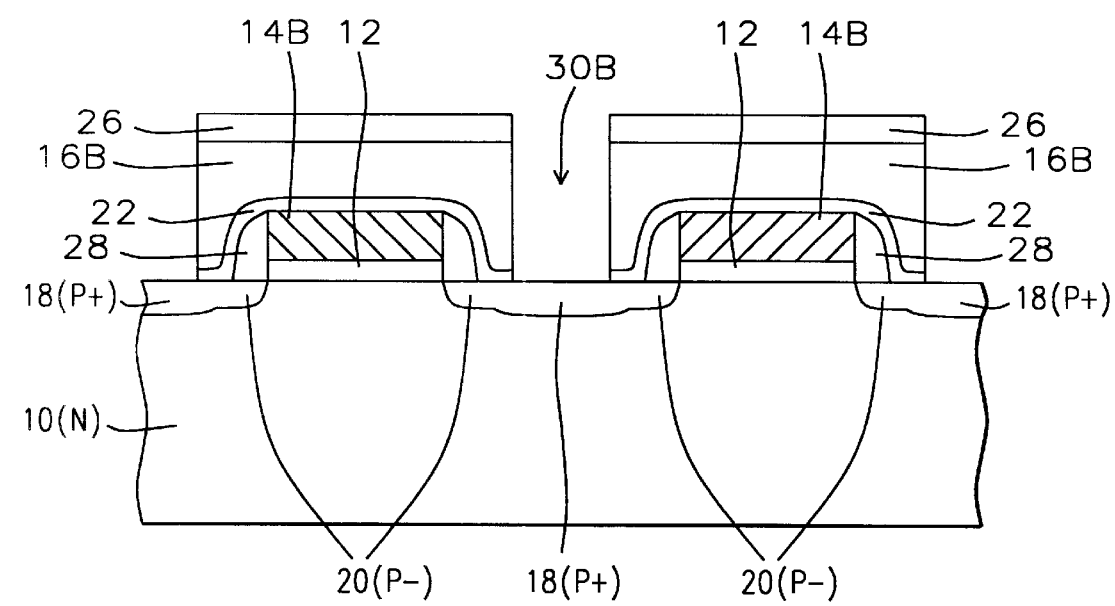
FIG. 2

METHOD TO REDUCE DEVICE CONTACT RESISTANCE USING A HYDROGEN PEROXIDE TREATMENT

BACKGROUND OF THE INVENTION (1) Field of the Invention

The present invention relates to a method for semiconductor manufacturing and more specifically the cleaning of the surface of a semiconductor device prior to the deposition of the contact metallization layer, and particularly, to a method utilizing a hydrogen peroxide cleaning treatment to remove traces of contaminants in the metal contact area prior to the deposition of the contact metal.

(2) Description of Prior Art

As circuit density and therefore device density increases, metal contact dimensions have to be decreased accordingly to minimize the contact area as part of the total chip area. Contact resistance is normally inverse to contact size, that is the smaller the contact size, the higher the contact resistance. This makes contact resistance a significant and sometimes dominant factor in very large scale integration (VLSI) metal system performance. Therefore an important element in the manufacturing and subsequent operation of integrated circuit devices is the electrical contacts and associated contact resistance which are required to conduct the power and signals throughout the integrated circuitry.

For example, for a typical metal oxide semiconductor field effect transistor (MOSFET), these contacts are fabricated through the standard lithographic process utilizing photoresist with optical masks to pattern the contact areas. As illustrated in FIG. 1, a cross section of two typical FET devices are shown. A thin silicon dioxide layer ($SiO_2$) 12 typically between 80 and 150 Å thick is placed on a substrate 10 as a gate oxide dielectric. This is normally followed by a deposition of polysilicon 14A to a nominal thickness of 3150 Å for the gate control voltage electrode, followed by a tetraethyl orthosilicate (TEOS) oxide layer 16A nominally 3000 Å thick for gate insulation and spacer isolation. After patterning and a TEOS and poly etching processes, a thin layer of silicon nitride (SIN) 22 is deposited to a nominal thickness of 300 Å over the TEOS layer 16A followed by a final contact passivation dielectric of boron phosphorous silicon glass (BPSG) 24 to a nominal thickness of 3000 Å. The structure is subsequently patterned with photoresist (PR) 26 and the contact hole 30A is opened with a wet isotropic etch to produce the structure shape depicted in FIG. 1 in preparation for contact metallization. This contact hole requires a cleaning process that assures good metal contact and subsequent low contact resistance. The final contact opening process is typically a dry etch cleaning step using a gas containing fluorine. This etch is typically followed by a nominal 2 minute buffered oxide etch (BOE) wet dip cleaning step prior to contact metal sputtering. As contact hole dimension is reduced from 2 um to 1 um, this BOE premetal dip does not always remove a fluoride residue left from the dry etch process. Since fluorine acts as a donor element, this residue can affect the contact resistance for a P+ to metal contact. This perturbation in contact resistance can effect device performance and impact process yields for small contact hole devices. It is desired to define a method for improving contact cleaning prior to metal deposition thereby improving the metal contact ohmic resistance maintaining or improving device performance and process yields. U.S. Pat. No. 4,752,505 to Arac teaches a pre-metal deposition clean for B—Si—O insulating layer. U.S. Pat. No. 5,486,266 to Tsia et al shows a method of cleaning a silicon contact surface using $H_2O_2$. U.S. Pat. No. 5,229,334 to Kato shows a method of forming a gate insulating layer by cleaning using $H_2O_2$. U.S. Pat. No. 5,308,400 to Chen shows a wafer cleaning process using $H_2O_2$. U.S. Pat. No. 5,670,019 to Huang shows a $H_2O_2$ cleaning process for removing precipitates after a tungsten etchback process. U.S. Pat. No. 5,801,096 to Lee et al shows a method of forming contact holes and filling the holes with metal.

SUMMARY OF THE INVENTION

Accordingly, it is the primary objective of the invention to provide an effective and manufacturable method for cleaning the surface of a partially manufactured integrated circuit so that a subsequently deposited metal film will adhere well to the surface and have a well controlled contact resistance, thereby enhancing device yield and performance.

Furthermore, it is the objective of the invention to maintain or improve contact resistance while maintaining important device characteristics such as effective channel length (Leff) and device threshold voltage (Vtp).

Yet another object of the invention is to reduce or maintain the contact resistance and the range thereof, as the contact hole dimensions are reduced below 2.0 um to a nominal 1.0 um size range.

Another objective of the invention is to simplify the process by eliminating an insulating or passivation layer, while maintaining appropriate insulating, isolation and dielectric properties.

A separate aspect of this invention is to improve gate polysilicon passivation by using a single layer of 5K Å TEOS, or alternatively, using a single layer of 5 to 6K Å BPSG.

The above objectives are achieved by the methods of the invention which describes a process for developing a semiconductor device low resistance electrical contact. In this process a gate oxide layer followed by a polysilicon layer is deposited on the semiconductor substrate in proximity to the device contact area. It is subsequently patterned with photoresist and etched to produce the desired gate structure. This is followed by a deposited layer of silicon dioxide or silicon nitride (SIN) which is appropriately patterned and etched to form gate isolation spacers. Then a nominal 300 Å layer of silicon nitride (SIN) is deposited followed by a layer of tetraethyl orthosilicate (TEOS) or borophosphosilicate glass (BPSG). The contact area is defined by photolithography, and the passivation layers are etched either by a dry etch such as a RIE process, or a combination of a wet BOE process followed by a dry etch, to form the metal contact holes. Prior to sputtering the contact metal, the contact area is cleaned with a dip in a BEO solution, followed by a key aspect of the invention process, a Hydrogen Peroxide ($H_2O_2$) dip. This $H_2O_2$ cleaning step enables lower device contact resistance for the P+ contact areas which is essential to good device performance. It has the additional benefit of maintaining or enhancing product yield as the contact hole size is decreased to meet the requirements of ever larger scale device integration.

BRIEF DESCRIPTION OF THE DRAWINGS

FIG. 1 shows a cross section through 2 adjacent typical field effect transistors showing a prior art structure for making a FET semiconductor device with a 2 um device contact using a combination of TEOS and BPSG insulation and isolation.

FIG. 2 shows one form of the invention showing a cross section through 2 adjacent typical field effect transistors with a 1 um contact hole and which utilizes a nominal 3K Å layer of TEOS passivation for the oxide and nominal 3500 Å polysilicon self aligned gate (SAG) structure.

DESCRIPTION OF THE PREFERRED EMBODIMENTS

Figure 3:
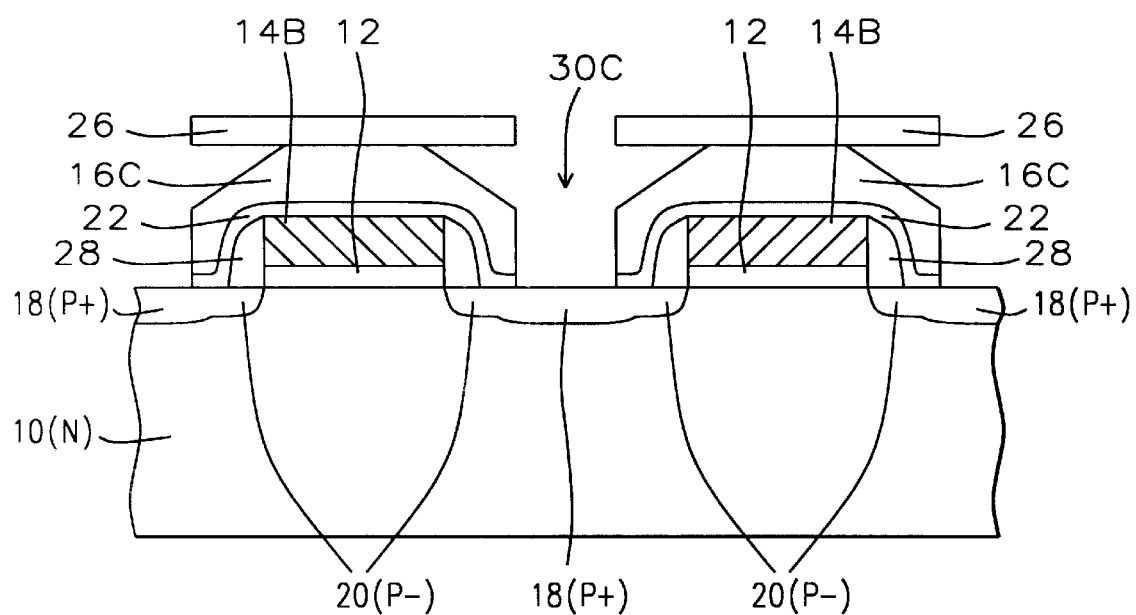
FIG. 3 shows an alternative form of the invention structure by representing a cross section through 2 adjacent typical field effect transistors for a 1 um device contact, using a nominal 3500 Å polysilicon gate element covered by a layer of silicon nitride ($SiN_4$) followed by a single layer of either TEOS or BPSG.

Referring to FIG. 2 there is shown a cross section through two adjacent field effect transistors (FET) such as could be part of an integrated circuit. The substrate 10 on which the FET's were built is a body of N type silicon of single crystal orientation. A thin layer of oxide 12 is deposited on the substrate to form the gate oxide whose thickness determines the threshold voltage for the devices. The gate oxide film thickness is normally between 80 and 150 Å in thickness and is normally thermally grown by the dry oxidation method using oxygen and hydrogen gases. A layer of polycrystalline silicon (poly) 14B is deposited over the gate oxide, typically by low pressure chemical vapor deposition (LPCVD) to a nominal thickness of 3500 Å to serve as the gate electrode of the devices. The poly layer is usually doped with phosphorus or arsenic to increase the conductivity of the electrode. This nominal poly thickness is increased over the prior art shown in FIG. 1 to improve the poly masking ability used in the self aligned gate (SAG) process to shield the FET channel from unwanted dopent contamination during the source/drain heavy doping implant process. This increased poly thickness provides better gate threshold voltage (Vtp), control and stability. After appropriate patterning and etching to form the gate structure of oxide 12 and poly 14B, an oxide layer is deposited over the surface and etched to form the gate side spacers 28 to insulate the gate from the source drain.

The source/drain regions are made up of the P+ heavily doped regions 18 and P− lightly doped (LDD) regions 20. These source/drain regions are generally created by means of ion implantation as is well understood in the art. They will be contacted by a metal conductor not shown in the cross section, typically an alloy of aluminum with 2% silicon or a tungsten metallurgy system. The gates are covered by an insulating layer of silicon nitride (SIN) 22 typically deposited by low pressure chemical vapor deposition (LPCVD) or plasma enhanced chemical vapor deposition (PECVD) utilizing silane ($SiH_4$) or dichlorosilane ($SiCl_2H_2$) as source gases to a thickness between 200 and 400 Å, with a nominal thickness of 300 Å. A layer of TEOS oxide 16B is deposited over the SIN to a thickness typically between 2500 and 3500 Å using a PECVD with tetraethyl orthosilicate ($Si(OC_2H_5)$) source or silane with nitrous oxide in an argon plasma process. A unique feature of this embodiment of the invention places the SIN 22 directly over the poly electrode 14B and side spacer 28 and then uses the nominal 3000 Å TEOS 16B in place of the nominal 3000 Å BPSG 24 shown in prior art FIG. 1 as the final contact dielectric layer. This saves one masking and deposition step over the prior art.

The SIN 22 and TEOS 16B are subsequently patterned by photoresist 26 and anisotropically etched, typically by a plasma etch or a reactive ion etch (RIE) using fluorine as an etchant to open a contact hole 30B to allow contact to the source/drain and gate areas by a deposited layer of metal. The gate element contact area is not shown in this cross section. The anisotropic etch provides vertical walls of TEOS 16B surrounding the contact hole 30B and eliminating the thinner coverage over the poly step edge caused by the curved surface of the TEOS 16A and SIN 22 isotropic etch shown in FIG. 1.

Just prior to the deposition of the contact metallurgy it is necessary to properly prepare the surface of the device. If this is not done residues may cause a layer of relatively high electrical resistivity between the source/drain diffusion 18 and the metal. Because the area of the contact hole is very small, the absolute value of the resulting contact resistance can be significant and may be greater than what has been specified to be the maximum contact resistance. Therefore, following the etch process, the contact hole is cleaned first by a 30 second dip in a moderate BOE solution typically a ratio of 10 to 1 ammonium fluoride ($NH_4F$) hydrofluoric acid (HF) mixed in water, followed by a key aspect of the invention, a dip in an active solution of 49% $H_2O_2$ and water for between 10 and 30 minutes. This $H_2O_2$ cleaning step has the advantage over the previous process of more completely removing the fluoride residues left from the previous dry etch process improving the device contact resistance, and subsequently performance as well as improving product yield. The cleaning process is completed with a deionized water rinse.

FIG. 3 is an alternate embodiment of the invention. For increased passivation protection the nominal 3K Å TEOS layer 16B shown in FIG. 2 can be increased to a nominal 5K Å TEOS 16C thickness shown in FIG. 3. The etching process for this thickness TEOS is first an isotropic wet etch using a BOE solution typically a ratio of 10 to 1 ammonium fluoride ($NH_4F$) hydrofluoric acid (HF) mixed in water, for approximately the first 1500 Å followed by an anisotropic dry etch such as a RIE process for the nominally 3500 Å thick remaining TEOS layer 16C. This process produces the contact hole profile 30C shown in FIG. 3. After the etching process is complete, the contact hole is cleaned using the previously described BOE for a nominal 30 seconds followed by the $H_2O_2$ dip for between 10 and 30 minutes followed by the deionized water rinse. This device passivation profile provides a more robust passivation of the semiconductor devices.

A third embodiment of the invention would be to change the TEOS passivation layer 16C to a BPSG layer with a 6K Å nominal thickness. The etching process for this material would be the same as for the second embodiment, that is, a wet isotropic etch followed by a dry anisotropic etch to provide a similar profile for the contact hole 30C as represented in FIG. 3. After the etching process is complete, the contact hole is cleaned using the previously described BOE for a nominal 30 seconds followed by the $H_2O_2$ dip for between 10 and 30 minutes followed by the deionized water rinse. This device passivation profile also provides a more robust passivation of the semiconductor devices than the prior art process.

It should be understood that while the application of the invention has been described through means of an example based on an FET device contained within an integrated circuit, the scope of the device is not limited to FET's or even integrated circuits.

While the invention has been particularly shown and described with reference to the preferred embodiments thereof, it will be understood by those skilled in the art that various changes in form and details may be made without departing from the spirit and scope of the invention.

What is claimed is:

1. A method of cleaning the surface of a partially manufactured integrated circuit prior to contact metal deposition on said surface comprising:

dipping the said surface in a buffered oxide etch (BOE);

then immersing said surface in a solution consisting of hydrogen peroxide ($H_2O_2$) and water;

rinsing in deionized water in preparation for metal sputtering.

2. The method of claim 1 where the BOE contains from 8 to 10 parts ammonium fluoride ($NH_4F$) to 1 part hydrofluoric acid (HF) mixed water.

3. The method of claim 1 where said BOE dip is for a duration of between 20 and 40 seconds.

4. The method of claim 1 whereby said hydrogen peroxide bath is composed by volume of between 48% and 50% active parts hydrogen peroxide ($H_2O_2$) to water.

5. The method of claim 1 whereby the duration of said $H_2O_2$ dip is between 10 and 30 minutes.

6. The method of claim 1 where the resistance of said deionized water is between 16 and 22 megohm-cm.

7. A method of simplifying the process of FET SAG gate passivation of a semiconductor device with a 1 um contact hole on a semiconductor substrate comprising:

depositing a layer of gate oxide on said substrate;

depositing a doped layer of polysilicon over said gate oxide;

anisotropically etching said poly and gate oxide to form the gate electrode element;

depositing a layer of oxide over said gate electrode element;

isotropically etching said oxide to form gate oxide spacers;

depositing a layer of SIN over said gate structure;

depositing a layer of TEOS over said SIN and said gate structure;

patterning said TEOS and SIN with photoresist to define contact metallization hole;

etching said TEOS and SIN to open said contact hole;

cleaning said contact hole opening with a BOE solution followed by a solution consisting of $H_2O_2$ and water followed by a deionized water rinse.

8. The method of claim 7 whereby said poly is deposited to a thickness of between about 3400 Å and 3600 Å.

9. The method of claim 7 whereby said SIN passivation is deposited to a thickness of between about 250 Å and 350 Å.

10. The method of claim 7 whereby said TEOS passivation is deposited by CVD processing using tetraethyl orthosilicate as a source to a thickness of between about 2900 Å and 3100 Å.

11. The method of claim 7 wherein said contact hole is created using anisotropic, RIE processing using a fluorine based etchant.

12. The method of claim 7 where said BOE cleaning solution contains from 8 to 10 parts ammonium fluoride ($NH_4F$) to 1 part hydrofluoric acid (HF) mixed with water, and is for a duration of between 20 and 40 seconds.

13. The method of claim 7 whereby said hydrogen peroxide cleaning bath is composed by volume of between 48% and 50% active parts hydrogen peroxide ($H_2O_2$) to water and is between 10 and 30 minutes in duration.

14. The method of claim 7 where the resistance of said deionized water is between 16 and 22 megohm-cm.

15. A method of improving FET SAG gate passivation of a semiconductor device with a 1 um contact hole on a semiconductor substrate comprising:

depositing a layer of gate oxide on said substrate;

depositing a doped layer of polysilicon over said gate oxide;

anisotropically etching said poly and gate oxide to form the gate electrode element;

depositing a layer of oxide over said gate electrode element;

isotropically etching said oxide to form gate oxide spacers;

depositing a layer of SIN over said gate structure;

depositing a layer of TEOS over said SIN and said gate structure;

patterning said TEOS and SIN with photoresist to define contact metallization hole;

performing an isotropic partial etch on said TEOS;

completing said etch using an anisotropic etch on remaining said TEOS and said SIN;

cleaning said contact hole opening with a BOE solution followed by a solution consisting of $H_2O_2$ and water followed by a deionized water rinse.

16. The method of claim 15 whereby said poly is deposited to a thickness of between about 3400 Å and 3600 Å.

17. The method of claim 15 whereby said SIN passivation is deposited to a thickness of between about 250 Å and 350 Å.

18. The method of claim 15 whereby said TEOS passivation is deposited by CVD processing using tetraethyl orthosilicate as a source to a thickness of between about 4800 Å and 5200 Å.

19. The method of claim 15 wherein said contact hole is created using an isotropic wet etch to remove between 1300 Å and 1700 Å of the TEOS.

20. The method of claim 15 wherein a anisotropic dry etch of said TEOS and said SIN is performed to open said contact hole to said source/drain substrate surface.

21. The method of claim 15 where said BOE cleaning solution contains from 8 to 10 parts ammonium fluoride ($NH_4F$) to 1 part hydrofluoric acid (HF) mixed with water, and is for a duration of between 20 and 40 seconds.

22. The method of claim 15 whereby said hydrogen peroxide cleaning bath is composed by volume of between 48% and 50% active parts hydrogen peroxide ($H_2O_2$) to water and is between 10 and 30 minutes in duration.

23. The method of claim 15 where the resistance of said deionized water is between 16 and 22 megohm-cm.

24. A method of improving FET SAG gate passivation of a semiconductor device with a 1 um contact hole on a semiconductor substrate comprising:

depositing a layer of gate oxide on said substrate;

depositing a doped layer of polysilicon over said gate oxide;

anisotropically etching said poly and gate oxide to form the gate electrode element;

depositing a layer of oxide over said gate electrode element;

isotropically etching said oxide to form gate oxide spacers;

depositing a layer of SIN over said gate structure;

depositing a layer of BPSG over said SIN and said gate structure;

patterning said BPSG and SIN with photoresist to define contact metallization hole;

etching said BPSG and SIN to open said contact hole;

cleaning said contact hole opening with a BOE solution followed by a solution consisting of $H_2O_2$ and water followed by a deionized water rinse.

25. The method of claim 24 whereby said poly is deposited to a thickness of between about 3400 Å and 3600 Å.

26. The method of claim 24 whereby said SIN passivation is deposited to a thickness of between about 250 Å and 350 Å.

27. The method of claim 24 whereby said BPSG passivation is deposited by CVD processing using tetraethyl orthosilicate as a source to a thickness of between about 5800 Å and 6200 Å.

28. The method of claim 24 wherein said contact hole is created using an isotropic wet etch to remove between 1300 Å and 1700 Å of the TEOS.

29. The method of claim 24 wherein a anisotropic dry etch of said TEOS and said SIN is performed to open said contact hole to said source/drain substrate surface.

30. The method of claim 24 where said BOE cleaning solution contains from 8 to 10 parts ammonium fluoride ($NH_4F$) to 1 part hydrofluoric acid (HF) mixed with water, and is for a duration of between 20 and 40 seconds.

31. The method of claim 24 whereby said hydrogen peroxide cleaning bath is composed by volume of between 48% and 50% active parts hydrogen peroxide ($H_2O_2$) to water and is between 10 and 30 minutes in duration.

32. The method of claim 24 where the resistance of said deionized water is between 16 and 22 megohm-cm.

* * * * *